(12) United States Patent
Kim et al.

(10) Patent No.: US 7,998,661 B2
(45) Date of Patent: Aug. 16, 2011

(54) METHOD OF NANO-PATTERNING USING SURFACE PLASMON EFFECT AND METHOD OF MANUFACTURING NANO-IMPRINT MASTER AND DISCRETE TRACK MAGNETIC RECORDING MEDIA USING THE NANO-PATTERNING METHOD

(75) Inventors: Hae-sung Kim, Hwaseong-si (KR); Myung-bok Lee, Suwon-si (KR); Jin-seung Sohn, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 740 days.

(21) Appl. No.: 12/048,421

(22) Filed: Mar. 14, 2008

(65) Prior Publication Data

US 2009/0087793 A1 Apr. 2, 2009

(30) Foreign Application Priority Data

Oct. 1, 2007 (KR) ........................ 10-2007-0098901

(51) Int. Cl.
*G03F 7/20* (2006.01)
(52) U.S. Cl. ........................................ 430/320; 430/323
(58) Field of Classification Search ........................ None
See application file for complete search history.

(56) References Cited

U.S. PATENT DOCUMENTS

2005/0170657 A1 8/2005 Khang et al.

FOREIGN PATENT DOCUMENTS

| JP | 2005-303197 A | * | 10/2005 |
| WO | 2005/001569 A1 | | 1/2005 |
| WO | 2005/017570 A2 | | 2/2005 |

OTHER PUBLICATIONS

Computer-generated translation of JP 2005-303197 (Oct. 2005).*
McNab, S. J., Blaikie, R.J., Alkaisi, M. M. "Analytic Study of Gratings Patterned by Evanescent Near Field Optical Lithography", Journal of Vacuum Science and Technology. Nov. 1, 2000, vol. 18, No. 6. New York, NY, US.
Arnold, Matthew D., Blaikie, Richard J. "Using Surface-plasmon Effects to Improve Process Latitute in Near-field Optical Lithography" Proceedings of the 2006 International Conference on Nanoscience and Nonotechnology. Institute of Electical and Electronics Engineers. 2006, pp. 548-551.
Shao, D. B., Chen, S.C. "Surface-plasmon-assisted Nanoscale Photolithography by Polarized Light". Applied Physics Letters, American Institute of Physics. vol. 86, No. 25, Jun. 16, 2005. Melville, NY, US.

* cited by examiner

*Primary Examiner* — John A. McPherson
(74) *Attorney, Agent, or Firm* — Sughrue Mion, PLLC

(57) ABSTRACT

A method of nano-patterning, a method of manufacturing a nano-imprinting master and a discrete track magnetic recording medium are all provided. The method of nano-patterning includes (a) sequentially forming on a substrate an etching object material layer, a photoresist layer, and a metal layer patterned to a first pattern having a structure in which line patterns are repeatedly arranged with a predetermined interval; (b) irradiating light onto a surface of the metal layer to excite surface plasmon so that the photoresist layer is exposed to a second pattern by the surface plasmon; (c) removing the metal layer and developing the photoresist layer; and (d) etching the etching object material layer using the photoresist layer patterned to the second pattern as a mask.

25 Claims, 12 Drawing Sheets

METHOD OF NANO-PATTERNING USING SURFACE PLASMON EFFECT AND METHOD OF MANUFACTURING NANO-IMPRINT MASTER AND DISCRETE TRACK MAGNETIC RECORDING MEDIA USING THE NANO-PATTERNING METHOD

CROSS-REFERENCE TO RELATED PATENT APPLICATIONS

This application claims priority from Korean Patent Application No. 10-2007-0098901, filed on Oct. 1, 2007, in the Korean Intellectual Property Office, the disclosure of which is incorporated herein in its entirety by reference.

BACKGROUND OF THE INVENTION

1. Field of the Invention

The present invention relates to a method of nano-patterning that realizes a high pattern density using a surface plasmon effect and a method of manufacturing a nano-imprinting master that can copy a nano-pattern and a discrete track magnetic recording medium for high density magnetic recording using the nano-patterning method.

2. Description of the Related Art

Recently, a method of nano-patterning that can realize a minute line width has received much attention. For example, in a semiconductor apparatus, a further increase in the number of devices per unit area is required in order to achieve a high integration density, and for this purpose, there is a need to develop a process for forming high density minute patterns.

Also, a high recording density of hard disc drives is required in magnetic recording fields, and to meet this requirement, patterned media such as discrete track media or bit patterned media have been developed as recording media. The patterned media includes discrete track media in which recording regions are separated by a track unit, and bit patterned media in which recording regions are separated by a bit unit. In order to manufacture these media, a process of forming a minute pattern is used.

A related art photolithography method is limited in its ability to manufacture the minute pattern, and thus, many studies have been conducted to use an electron beam lithography method and a nano-imprinting method in manufacturing the minute patterns.

FIGS. 1A through 1D are cross-sectional views showing a related art method of nano-patterning using an electron beam lithography method. Referring to FIG. 1A, an etching object material layer 20 (a material layer to be etched) and an electron beam resist layer 30 are formed on a substrate 10. As depicted in FIG. 1B, an exposing process is performed by using an electron beam to radiate along a pattern shape to be manufactured. Afterwards, as depicted in FIG. 1C, a pattern is formed in the electron beam resist layer 30 by developing the resultant product of FIG. 1B. Next, the etching object material layer 20 is etched using the electron beam resist layer 30 as a mask, and then, a nano-pattern is formed and the electron beam resist layer 30 is removed, with the resultant product depicted in FIG. 1D. In order to stably realize a pattern having an even deeper structure in the etching object material layer 20, it is possible that by forming a hard mask layer formed of a material such as $SiO_2$ between the etching object material layer 20 and the electron beam resist layer 30 and transferring a pattern of the electron beam resist layer 30 to the hard mask layer, a minute pattern can be formed by patterning the etching object material layer 20.

While the method of manufacturing a minute pattern using electron beam lithography described above has an advantage in that a minute line width can be more precisely controlled when compared to a conventional photo lithography process, there is a disadvantage in that as the pattern density increases, an increasingly higher lithographic resolution and an increasingly longer exposure time are required. Therefore, process costs and the possibility of increasing defects are increased.

SUMMARY OF THE INVENTION

To address the above and/or other problems, exemplary embodiments of the present invention provides a method of nano-patterning that can realize a minute line width and high pattern density using a surface plasmon effect and a method of manufacturing a nano-patterning master and a discrete track magnetic recording medium using the method of nano-patterning.

According to an aspect of the present invention, there is provided a method of nano-patterning comprising: (a) sequentially forming an etching object material layer, a photoresist layer, and a metal layer patterned to a first pattern having a structure in which patterns are repeatedly arranged with a predetermined interval on a substrate; (b) irradiating light onto a surface of the metal layer to excite surface plasmon so that the photoresist layer is exposed to a second pattern by the surface plasmon; (c) removing the patterned metal layer and developing the photoresist layer; and (d) etching the etching object material layer using the photoresist layer patterned to the second pattern as a mask.

According to another aspect of the present invention, there is provided a method of manufacturing a master, comprising: (a) sequentially forming a photoresist layer and a metal layer patterned to a first pattern having a structure in which patterns are repeatedly arranged and separated by a predetermined interval on a substrate; (b) irradiating light onto a surface of the metal layer to excite surface plasmon so that the photoresist layer is exposed to a second pattern by the surface plasmon; (c) removing the patterned metal layer and developing the photoresist layer; and (d) etching the substrate using the photoresist layer patterned to the second pattern as a mask.

According to a still further aspect of the present invention, there is provided a method of manufacturing a discrete track magnetic recording medium comprising: (a) sequentially forming an under layer, a recording layer, a photoresist layer, and a metal layer patterned to a first pattern having a structure in which line patterns that form concentric circles are repeatedly arranged with a predetermined interval on a substrate; (b) irradiating light onto a surface of the metal layer to excite surface plasmon so that the photoresist layer is exposed to a second pattern by the surface plasmon; (c) removing the patterned metal layer and developing the photoresist layer; and (d) etching the recording layer using the photoresist layer patterned to the second pattern as a mask.

BRIEF DESCRIPTION OF THE DRAWINGS

The above and other features and aspects of the present invention will become more apparent by describing in detail exemplary embodiments thereof with reference to the accompanying drawings, in which.

DETAILED DESCRIPTION OF EXEMPLARY EMBODIMENTS OF THE INVENTION

Figure 1A:
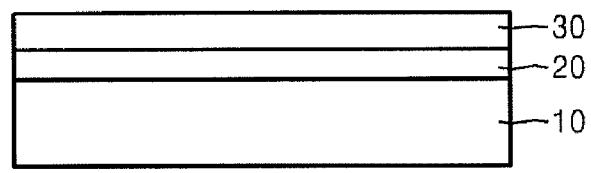
FIGS. 1A through 1D are cross-sectional views for explaining a related art method of forming a minute pattern.
Figure 1B:
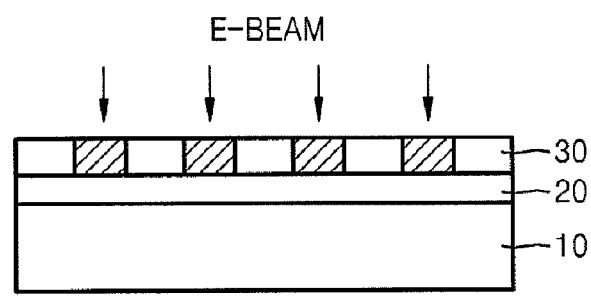
Figure 1C:
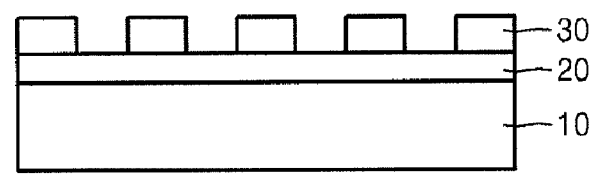
Figure 1D:
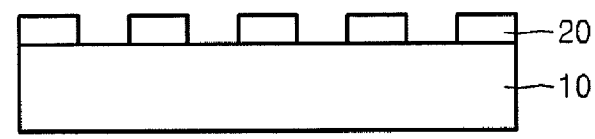

The present invention will now be described more fully with reference to the accompanying drawings in which exemplary embodiments of the invention are shown. In the drawings, the thicknesses of layers and regions are exaggerated for clarity, and like reference numerals refer to like elements.

Figure 2A:
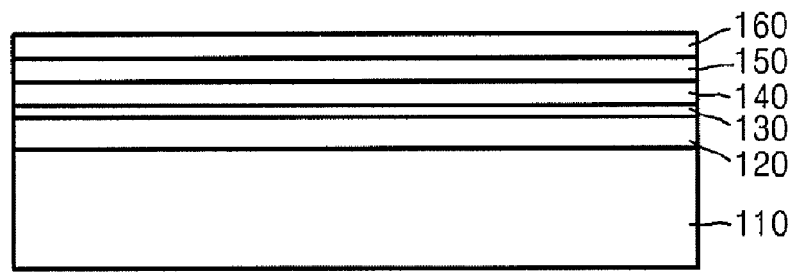
FIGS. 2A through 2K are cross-sectional views for explaining a method of nano-patterning according to an exemplary embodiment of the present invention.

FIGS. 2A through 2K are cross-sectional views for explaining a method of nano-patterning according to an exemplary embodiment of the present invention. Referring to FIG. 2A, an etching object material layer 120, a photoresist layer 140, a metal layer 150, and a polymer layer 160 are formed on a substrate 110. An antireflection film 130, such as a bottom antireflective coating (BARC) for preventing the photoresist layer 140 from being re-exposed to light reflected by the substrate 110 when the light is radiated during an exposure process, can further be formed between the etching object material layer 120 and the photoresist layer 140. The metal layer 150 is formed to expose the photoresist layer 140 by exciting surface plasmon in a subsequent process, and can be formed of a material selected from one or more of, for example, Au, Al, Ag, Cr, Ni, Ti, Ta, or W. The metal layer 150 can be formed using a process such as sputtering, plasma enhanced chemical vapor deposition (PECVD), low pressure chemical vapor deposition (LPCVD), or atomic layer deposition (ALD). The polymer layer 160 is formed to be used for a mask for etching the metal layer 150 after the polymer layer 160 is patterned to a predetermined pattern, and is formed of an appropriate material according to the method of patterning the polymer layer 160. For example, the polymer layer 160 can be formed of a nano-imprinting resin formed of an ultraviolet ray (UV) curable polymer or a heat curable polymer. More specifically, the polymer layer 160 can be formed of an acrylate group organic polymer or an organic-inorganic hybrid polymer that contains a photo initiator, or a UV curable negative photoresist for optical devices. Also, the polymer layer 160 can be formed of a thermal imprint resin such as polymethylmethacrylate (PMMA) or an inorganic spin-on-glass polymer such as hydrogen silsesquioxane (HSQ). The polymer layer 160 can be formed using dispensing, spin coating, spray coating, dip coating, ink jet coating, or vacuum deposition. If the polymer layer 160 is patterned using electron beam lithography, the polymer layer 160 can be formed of an electron beam resist material.

Figure 2B:

Referring to FIG. 2B, a nano-imprinting master 190 having a predetermined pattern is prepared. The nano-imprinting master 190 is formed of, for example, a material such as Si, Quartz, or Ni. An engraved first pattern to be formed in the polymer layer 160 is formed on the nano-imprinting master 190. The first pattern is formed to have a periodically repeated predetermined pattern shape, and has a pattern density lower than that of a second pattern to be formed in the etching object material layer 120. For example, the first pattern can have a line width greater than that of the second pattern, and can have an interval between repeated pattern lines a few times greater than that of the second pattern.

Figure 2C:
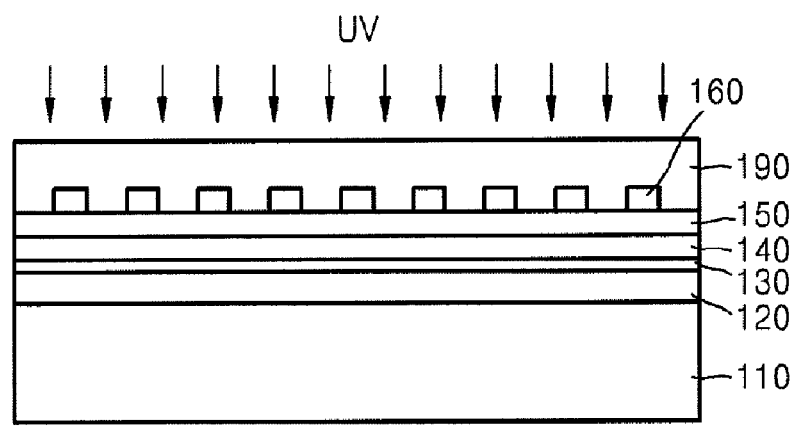
Figure 2D:
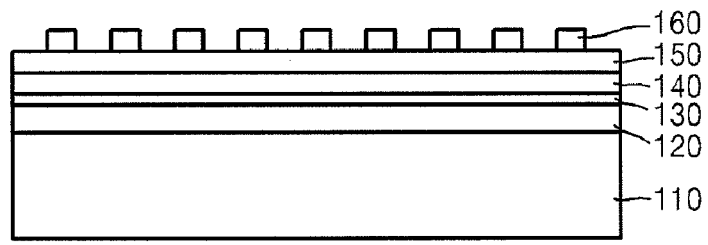

Referring to FIG. 2C, imprinting is performed by placing the nano-imprinting master 190 on the polymer layer 160 and irradiating UV rays onto the nano-imprinting master 190. At this time, it is possible to apply heat onto the nano-imprinting master 190 rather than irradiating UV rays, according to the material of the polymer layer 160. FIG. 2D depicts the result wherein the polymer layer 160 is patterned to the first pattern.

In this case, in order to describe the method of patterning the first pattern into the polymer layer 160, a nano-imprinting method is used as an example. However, if the polymer layer 160 is formed of an electron beam resist material, the polymer layer 160 can be patterned using an E-beam lithography method.

Figure 2E:
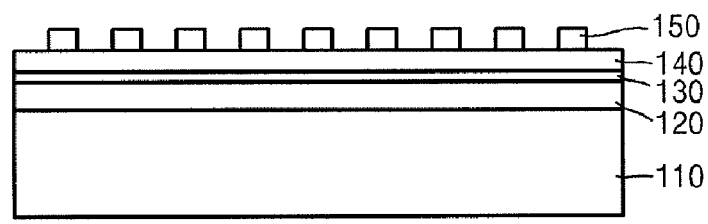

Next, as shown in FIG. 2E, the metal layer 150 is etched using the patterned polymer layer 160 as an etch mask, and the patterned polymer layer 160 is removed. Thus, the metal layer 150 is patterned to the first pattern. The etching of the metal layer 150 can be performed by a wet etching process, an ion beam milling process, or a plasma reactive ion etching (RIE) process.

Figure 2F:
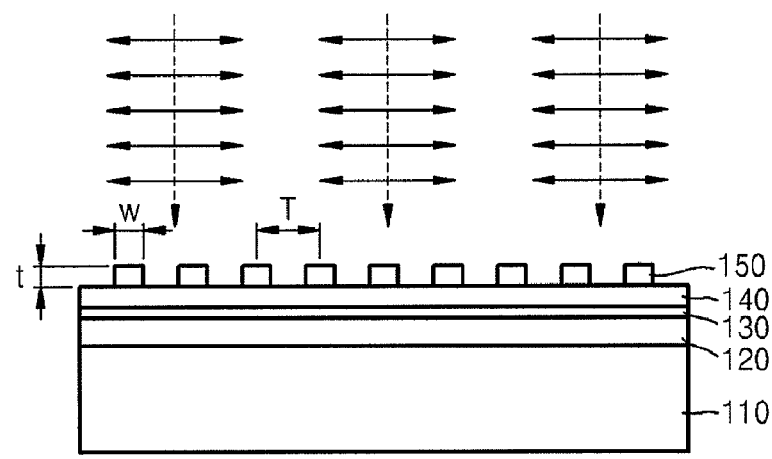

Referring to FIG. 2F, the photoresist layer 140 is exposed by exciting surface plasmon on a surface of the metal layer 150. Many studies have been conducted with regard to the conditions required for excitation of the surface plasmon. For example, it has been found that, if light having a wavelength sufficiently greater than the interval between pattern lines in a slit arrangement is irradiated onto a metal thin film, in which small slits are repeatedly formed, light polarized in a direction crossing the slits excites the surface plasmon. In the present embodiment, the photoresist layer 140 is exposed using such a surface plasmon effect. That is, if light having a wavelength sufficiently greater than the interval between pattern lines T, or preferably, greater than 4T is irradiated onto the metal layer 150, which is patterned to the first pattern that has a structure in which line patterns are repeatedly arranged, surface plasmon is excited on the surface of the metal layer 150, and the excited surface plasmon transmits optical energy to the photoresist layer 140 along the surface of the metal layer 150 in a surface plasmon wave form. In this case, light that contributes to the excitation of the metal layer 150 is light polarized in a direction in which the first pattern is repeatedly arranged, that is, in a direction perpendicular to the lengthwise direction of the line patterns, and is P-polarized light as depicted in FIG. 2F.

Figure 2G:
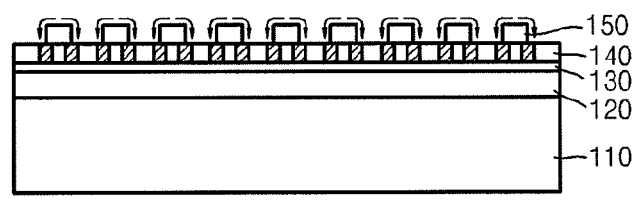
Figure 2H:
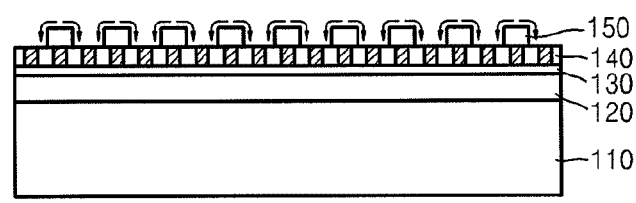

However, for this purpose, it is not essential to irradiate with P-polarized light by polarizing the incident, non-polarized light into P-polarized light. This is the case because if non-polarized light, that is, light in which randomly polarized light exists, is irradiated, only the P-polarized light contributes to the excitation of the surface plasmon, with light of the remaining polarizations, which are not passed through the patterned metal layer 150, not contributing to the excitation. However, polarizing light with a polarizing plate to produce P-polarized light is advantageous in consideration of efficiency. A pattern formed on the photoresist layer 140 resulting from exposure is determined by the distributing pattern of optical energy transmitted to the photoresist layer 140, and the distributing pattern of optical energy varies according to the interval between pattern lines T, line thickness t, and line width w of the patterned metal layer 150. For example, the distributing pattern of optical energy can be such that the optical energy is distributed on both side surfaces of pattern lines of the metal layer 150 having a predetermined line width to expose the photoresist layer 140 as depicted in FIG. 2G, or can be such that the optical energy is distributed to expose the middle portion of the photoresist layer 140 between the pattern lines of the patterned metal layer 150 due to the mutual interaction of surface plasmon waves generated on neighboring surfaces of the metal layer 150 as depicted in FIG. 2H. The two patterns of the exposed photoresist layer 140 are examples, and the exposing patterns can be varied to any form by appropriately controlling the interval between pattern lines T, line thickness t, and line width w of the metal layer 150 patterned to the first pattern. In any case, since the optical energy that exposes the photoresist layer 140 is transmitted to the photoresist layer 140 along only the surface of the metal layer 150, the optical energy forms a pattern having a line width smaller than that of the metal layer 150 and gaps between the patterns that are reduced. For example, a pattern formed on the photoresist layer 140 has a pattern density at least twice as great as that of the metal layer 150. The pattern formed on the photoresist layer 140 as a result of exposure is a second pattern to be formed on the etching object material layer 120.

Figure 2I:
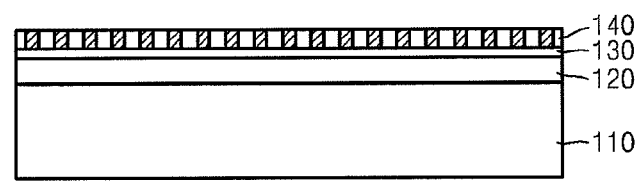
Figure 2J:
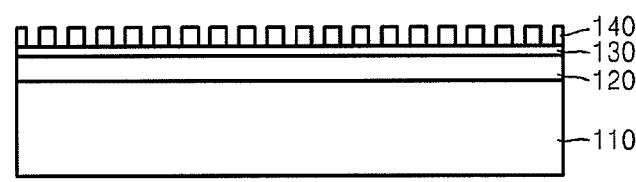

When the metal layer 150 is stripped, a resultant product having a shape as depicted in FIG. 2I is formed. Next, when the photoresist layer 140 is developed, as depicted in FIG. 2J, the pattern of the photoresist layer 140 corresponds to the second pattern. The metal layer 150 can also be removed during development of the photoresist layer 140.

Figure 2K:

Next, the antireflection film 130 is removed by $O_2$ plasma ashing and the etching object material layer 120 is etched by a dry etching method such as RIE using the patterned photoresist layer 140 as a mask. Afterwards, the remaining photoresist layer 140 and antireflection film 130 are removed, and thus, as depicted in FIG. 2K, the etching object material layer 120 is patterned to have the second pattern.

In the method of nano-patterning according to an exemplary embodiment of the present invention, a minute pattern can be readily formed since a high density pattern can be formed from a low density pattern after forming the low density pattern.

FIGS. 3A through 3J are cross-sectional views for explaining a method of manufacturing a nano-patterning master according to an exemplary embodiment of the present invention. The nano-imprinting master is formed to print a predetermined minute pattern structure in great quantities, and can be manufactured using the method of nano-patterning consistent with the present invention.

Figure 3A:
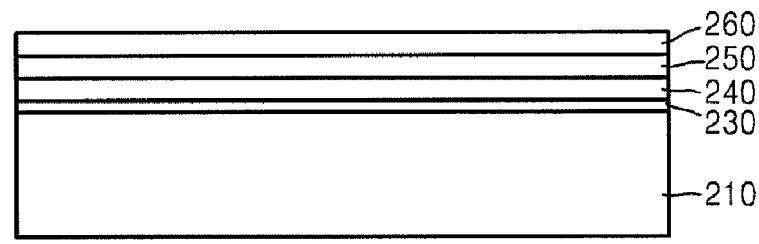
FIGS. 3A through 3J are cross-sectional views for explaining a method of manufacturing a nano-patterning master according to an exemplary embodiment of the present invention.

Referring to FIG. 3A, a photoresist layer 240, a metal layer 250, and a polymer layer 260 are formed on a substrate 210. An antireflection film 230 such as a BARC for preventing the photoresist layer 240 from being re-exposed to light reflected by the substrate 210 when the light is radiated during an exposure process can further be formed between the substrate 210 and the photoresist layer 240. The substrate 210 can be formed of a material such as Si, quartz, or Ni. The metal layer 250 is formed to expose the photoresist layer 240 by exciting surface plasmon in a subsequent process, and can be formed of a material selected from one or more of, for example, Au, Al, Ag, Cr, Ni, Ti, Ta, or W. The polymer layer 260 is formed to be used as an etch mask for etching the metal layer 250 after forming predetermined line patterns therein, and can be formed of an appropriate material, according to the method of pattering the polymer layer 260, which may be, for example, an electron beam resist material.

Figure 3B:
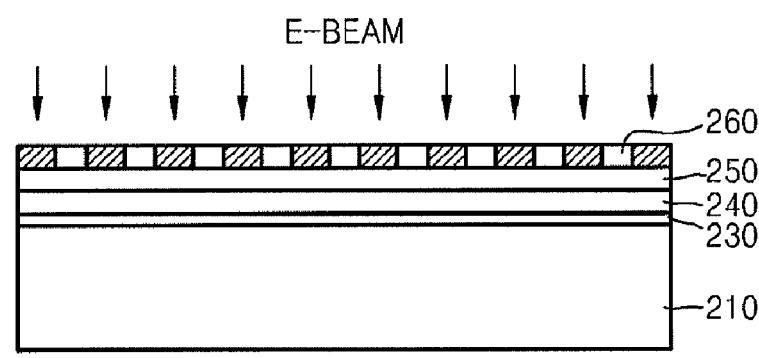

Referring to FIG. 3B, the polymer layer 260 is exposed to a first pattern by being irradiated with an E-beam. The first pattern is formed to have a shape in which, for example, line patterns are repeated and separated by a predetermined interval, and has a pattern density lower than that of a second pattern to be formed on a nano-imprinting master. The first pattern can have a line width greater than that of the second pattern, and can have an interval between repeated pattern lines a few times greater than that of the second pattern.

Figure 3C:
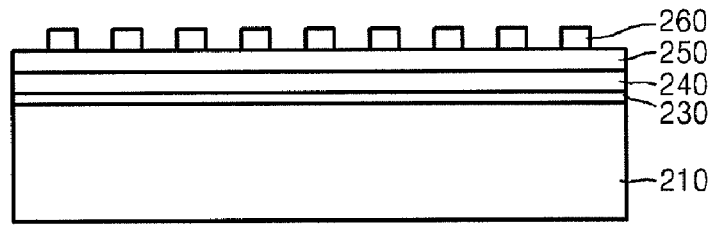
Figure 3D:
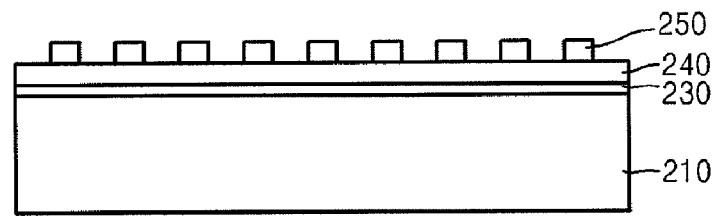

Referring to FIG. 3C, the polymer layer 260 is developed, and when the metal layer 250 is patterned using the polymer layer 260 patterned to the first pattern, as depicted in FIG. 3D, the metal layer 250 is patterned to the first pattern.

In this case, in order to explain the method of patterning the polymer layer 260 to the first pattern, an E-beam lithography method is used as an example. However, the polymer layer 260 can also be patterned to the first pattern using a nano-imprinting method.

Figure 3E:
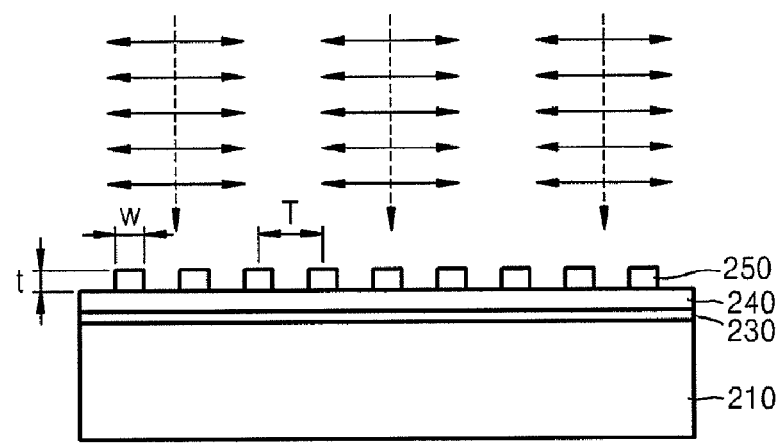
Figure 3F:
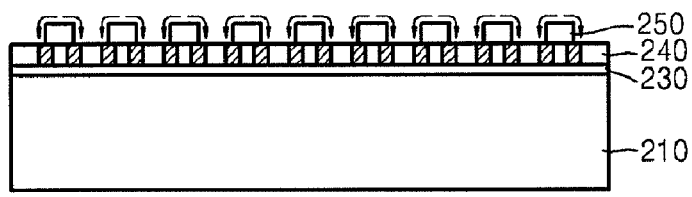
Figure 3G:
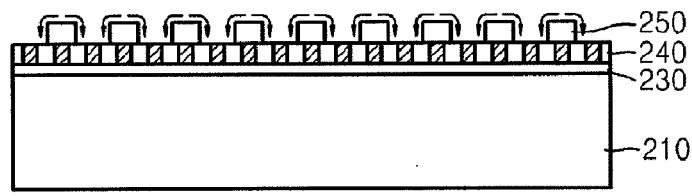
Figure 3H:
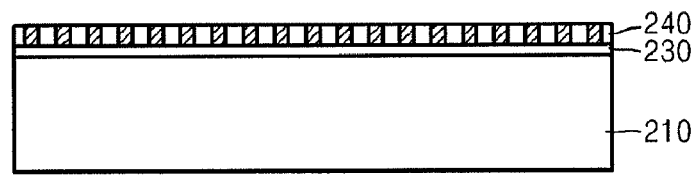
Figure 3I:
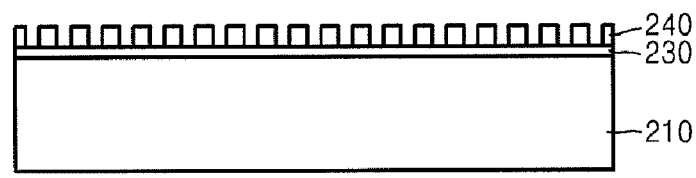
Figure 3J:

Referring to FIG. 3E, light is irradiated onto a surface of the patterned metal layer 250 so that surface plasmon can be excited. An exposure pattern of the photoresist layer 240 can be controlled by appropriately controlling the interval between pattern lines T, line thickness t, and line width w of the metal layer 250. The patterns resulting from exposure to optical energy transmitted by surface plasmon waves can be the patterns depicted in FIG. 3F or 3G, for example. When the metal layer 250 is stripped off, the photoresist layer 240 has a shape as depicted in FIG. 3H. Next, as shown in FIG. 3I, after the photoresist layer 240 is developed, and the antireflection film 230 and the substrate 210 are etched using the photoresist layer 240 patterned to the second pattern as a mask, the remaining photoresist layer 240 and the antireflection film 230 are removed. As a result, a nano-imprinting master having the second pattern as depicted in FIG. 3J is formed.

The master manufactured as described above has a pattern density higher than the first pattern formed using the E-beam lithography method in FIG. 3B, and great quantities of minute patterns can be printed using the master.

Figure 4:
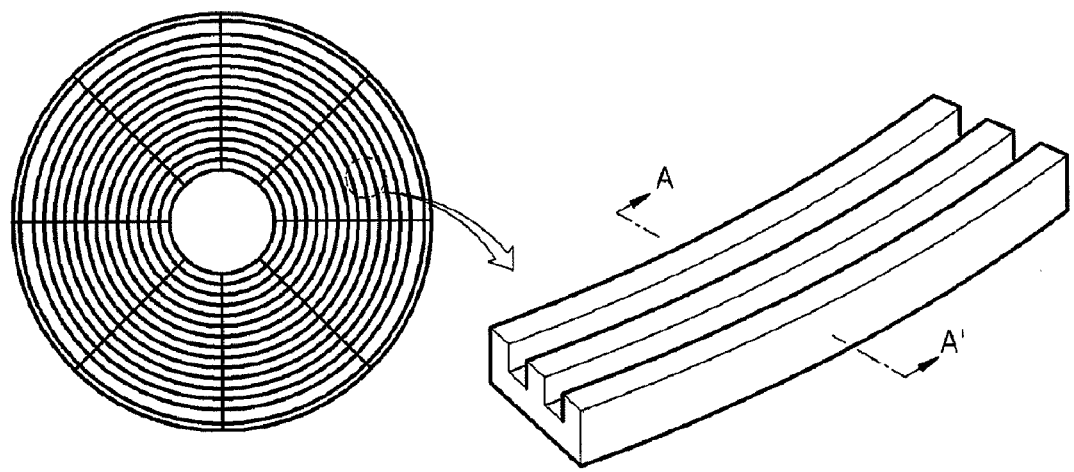
FIG. 4 is a schematic drawing of a discrete track magnetic recording medium to be manufactured in an exemplary embodiment of the present invention.

FIG. 4 is a schematic drawing of a discrete track magnetic recording medium to be manufactured in an exemplary embodiment of the present invention. FIGS. 5A through 5L are cross-sectional views for explaining a method of manufacturing the discrete track magnetic recording medium according to an exemplary embodiment of the present invention.

Referring to FIG. 4, the discrete track magnetic recording medium has a structure in which a recording layer is patterned along line patterns on a concentric circle, and the cross-sectional views depicted in FIGS. 5A through 5L are taken along line A-A' of FIG. 4.

Figure 5A:
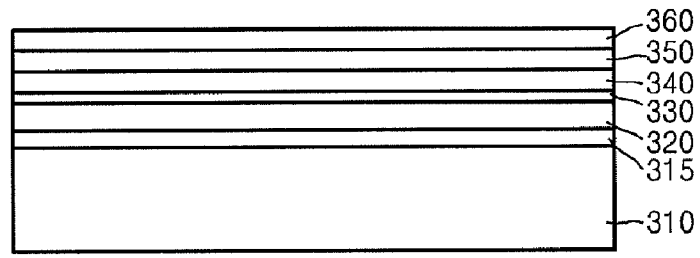
FIGS. 5A through 5L are cross-sectional views for explaining a method of manufacturing a discrete track magnetic recording medium according to an exemplary embodiment of the present invention.

Referring to FIG. 5A, an under layer 315, a recording layer 320, a photoresist layer 340, a metal layer 350, and a polymer layer 360 are sequentially formed on a substrate 310. An antireflection film 330 such as a BARC for preventing the photoresist layer 340 from being re-exposed to light reflected by the substrate 310 when the light is radiated during an exposure process can further be formed between the recording layer 320 and the photoresist layer 340. The under layer 315 includes a soft magnetic layer formed of a material that includes Ni or Fe and an intermediate layer formed of a material such as Ru. The recording layer 320 is formed of a magnetic material having good perpendicular magnetic anisotropy that includes at least one selected from, for example, Co, Fe, Pt, or Pd. The metal layer 350 is formed to expose the photoresist layer 340 by exciting surface plasmon, and formed of a metal selected from one or more of, for example, Au, Al, Ag, Cr, Ni, Ti, Ta, or W. The polymer layer 360 is used as a mask for etching the metal layer 350 after the polymer layer 360 is patterned to predetermined line patterns, and can be formed of an appropriate material according to the method of patterning the polymer layer 360. For example, the polymer layer 360 can be formed of a nano-imprinting resin formed of a UV curable polymer or a heat curable polymer.

Figure 5B:

Referring to FIG. 5B, a nano-imprinting master 390 on which a predetermined pattern is formed is prepared. The nano-imprinting master 390 can be formed of a material such as Si, quartz, or Ni, and has engraved thereon a first pattern that is to be formed on the polymer layer 360. The pattern density of the first pattern is lower than that of a second pattern to be formed on the recording layer 320.

Figure 5C:
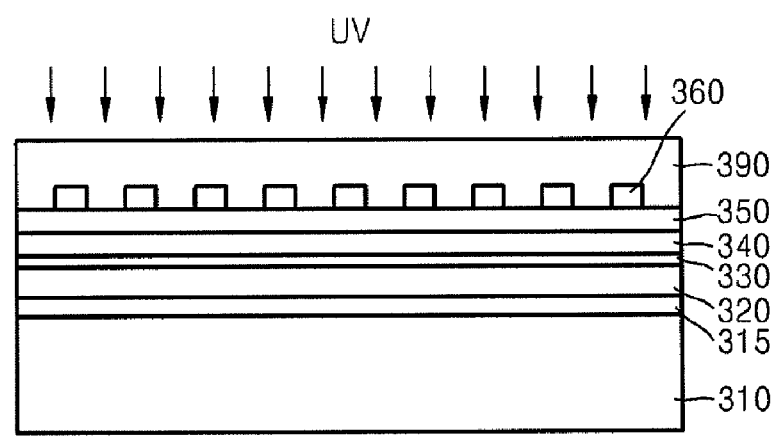
Figure 5D:
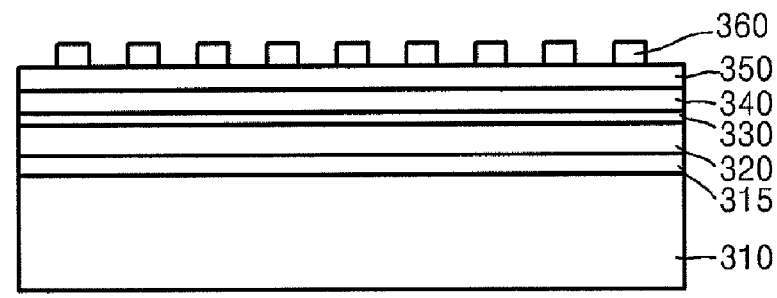

Referring to FIG. 5C, the nano-imprinting master 390 is placed on the polymer layer 360 and imprinting is performed. At this point, UV rays are irradiated. It is possible to apply heat onto the nano-imprinting master 190 rather than irradiating UV rays, according to the material of the polymer layer 160. After the imprinting operation, as depicted in FIG. 5D, the polymer layer 360 is patterned to the first pattern.

In this case, in order to pattern the polymer layer 360 into the first pattern, not only the nano-imprinting method can be used, but also, if the polymer layer 360 is formed of an electron beam resist material, an E-beam lithography method can be used.

Figure 5E:
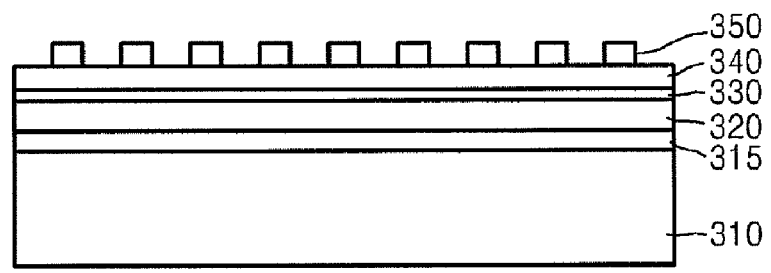

Next, the metal layer 350 is etched using the patterned polymer layer 360 as a mask, and the polymer layer 360 is removed. Thus, as depicted in FIG. 5E, the metal layer 350 is patterned to the first pattern.

Figure 5F:
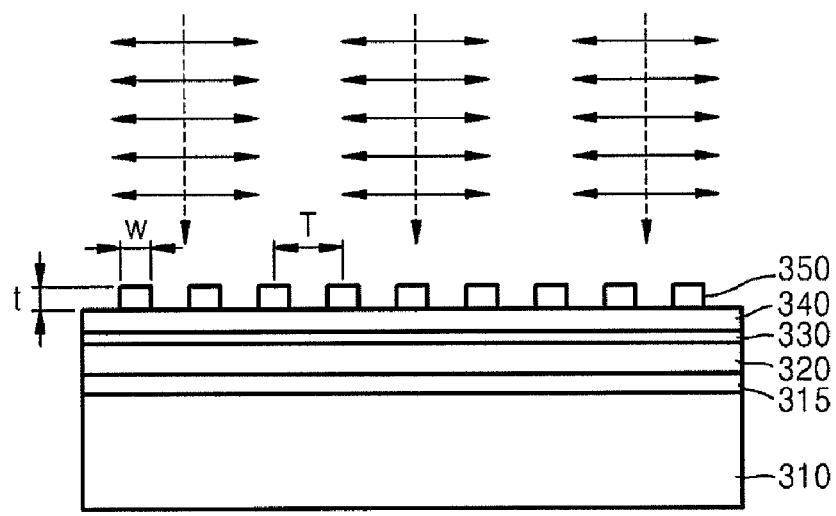

Next, referring to FIG. 5F, light is irradiated onto a surface of the patterned metal layer 350 to excite surface plasmon. The light to be irradiated has a wavelength greater than the interval between lines of the first pattern T, or preferably but not necessarily, greater than 4T. The light that contributes to the excitation of the surface plasmon on the surface of the metal layer 350 is light polarized in a direction in which the first pattern is repeatedly arranged, that is, in a direction perpendicular to a lengthwise direction of the line patterns, and is P-polarized light as depicted in FIG. 5F. However, for this purpose, it is not essential to irradiate with P-polarized light by polarizing the incident, non-polarized light into P-polarized light. This is the case because if non-polarized light, that is, light in which randomly polarized light exists, is irradiated, only P-polarized light contributes to the excitation of the surface plasmon, with light of the remaining polarizations not contributing to the excitation. However, polarizing light with a polarizing plate to produce P-polarized light is advantageous in consideration of efficiency.

Figure 5G:
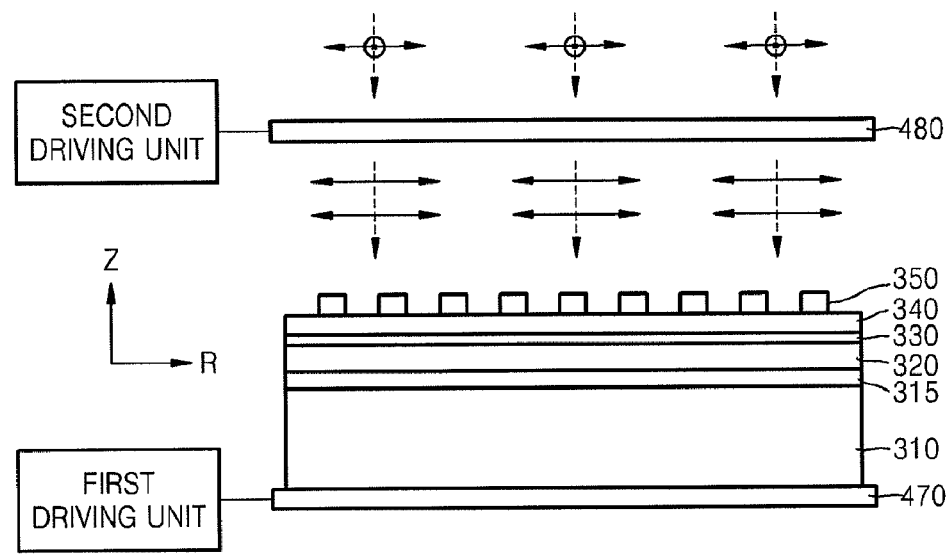

FIG. 5G is a cross-sectional view illustrating a method of irradiating P-polarized light. Referring to FIG. 5G, non-polarized light is polarized into P-polarized light using a polarizing plate 480 and the P-polarized light is irradiated onto the metal layer 350. At this point, since the line patterns of the metal layer 350 form concentric circles, after the substrate 310 on which the layers are formed is placed on a rotational stage 470 that rotates with respect to a rotation axis, that is, an axis of symmetry (Z axis) of the concentric circles, the rotational stage 470 can be driven by a first driving unit, for example, a spindle motor, during light irradiation. When light is irradiated in this manner, light polarized in a direction in which the line patterns are repeatedly arranged, that is, in a direction aligned with the radius (an R direction), is irradiated on any portion of the line patterns forming the concentric circles. If the polarizing plate 480 does not have a length in the R direction longer than the radius of the substrate 310, light can be irradiated while moving the polarizing plate 480 in the radius direction using a second driving unit.

Figure 5H:
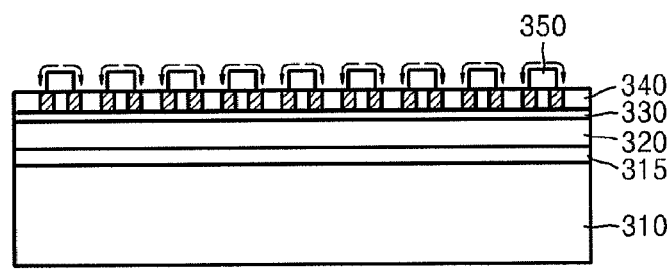
Figure 5I:
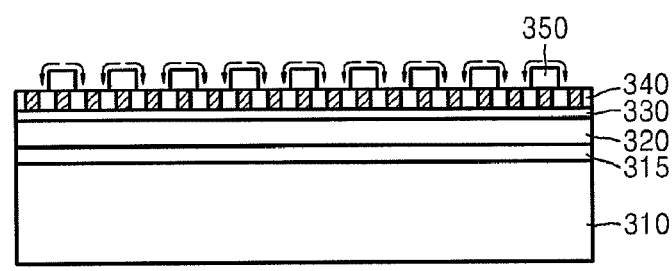

The surface plasmon excited on the surface of the metal layer 350 by P-polarized light transmits optical energy to the photoresist layer 340 along the surface of the metal layer 350, and thus, forms an exposure pattern. The exposure pattern of the photoresist layer 340 can be appropriately controlled by controlling the interval between pattern lines T, line thickness t, and line width w of the first pattern of the metal layer 350. For example, the exposure pattern formed due to the optical energy transmitted by the surface plasmon can have a shape corresponding to the optical energy distribution, for example, it can have a shape as depicted in FIG. 5H which results when the optical energy is distributed on both surfaces of pattern lines, having a predetermined line width, of the metal layer 350 to expose the photoresist layer 340. As another example, the exposure pattern can have a shape as depicted in FIG. 5I, which results when the optical energy is distributed to expose middle portions of the photoresist layer 340 between the lines of the patterned metal layer 350 due to the mutual interaction of surface plasmon waves generated on neighboring side surfaces of the metal layer 350. The two patterns of the exposed photoresist layer 340 are examples, and the exposure patterns can be varied to have any form by appropriately controlling the interval between pattern lines T, line thickness t, and line width w of the metal layer 350 having the first pattern. In any case, since the optical energy that exposes the photoresist layer 340 is transmitted to the photoresist layer 340 along only the surface of the metal layer 350, the optical energy forms an exposure pattern having a line width smaller than that of the metal layer 350 and a shape in which gaps between the patterns are reduced. For example, a pattern formed on the photoresist layer 340 has a pattern density at least twice as great as that of the metal layer 350.

Figure 5J:
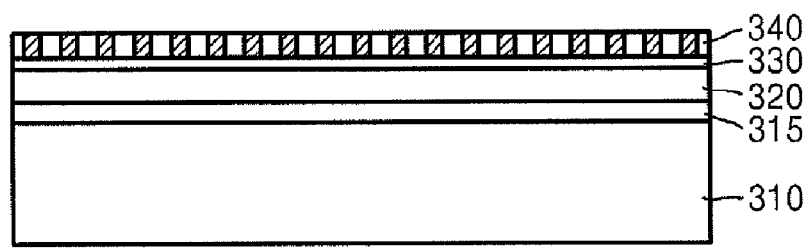
Figure 5K:
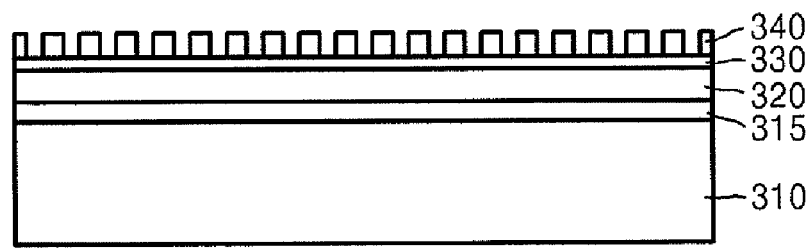

When the metal layer 350 is stripped off, a resultant product having a shape as depicted in FIG. 5J is formed. Next, referring to FIG. 5K, the photoresist layer 340 is developed, and the antireflection film 330 and the recording layer 320 are etched using the photoresist layer 340 patterned to the second pattern as a mask, and afterwards, the remaining photoresist layer 340 and the antireflection film 330 are removed. As a result, as depicted in FIG. 5L, a discrete track magnetic recording medium patterned to the second pattern is formed.

Figure 5L:
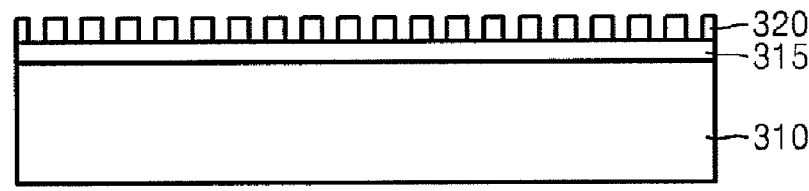

Although not shown, a protective film that protects the recording layer 320 from the outside and a lubrication film for preventing the protective film from wearing are generally further formed on the recording layer 320, and this process can be performed after the forming of the discrete track magnetic recording medium of FIG. 5L. Alternatively, after the protective film and the lubrication film are formed on the recording layer 320 in the operation of FIG. 5A, the subsequent processes can be performed.

A discrete track magnetic recording medium manufactured consistent with the method described above is formed to have a high pattern density by forming a first pattern having a low pattern density and afterwards using the first pattern having a low pattern density. Thus, a discrete track magnetic recording medium having a high density pattern can be readily formed, thereby providing a discrete track magnetic recording medium suitable for a high density recording medium.

While a method of nano-patterning and a method of manufacturing a nano-imprinting master and a discrete track magnetic recording medium using the method of nano-patterning consistent with the present invention have been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of nano-patterning comprising:
   (a) sequentially forming an etching object material layer, a photoresist layer, and a metal layer patterned to a first pattern having a structure in which patterns are repeatedly arranged with a predetermined interval on a substrate;

(b) irradiating light onto a surface of the metal layer to excite surface plasmon so that optical energy transmitted by the surface plasmon is distributed to expose middle portions of the photoresist layer between the patterns of the metal layer to form a second pattern on the photoresist layer;

(c) removing the patterned metal layer and developing the photoresist layer; and (d) etching the etching object material layer using the photoresist layer patterned to the second pattern as a mask.

2. The method of claim 1, wherein the first pattern is comprised of line patterns.

3. The method of claim 1, wherein the second pattern has a pattern density greater than that of the first pattern.

4. The method of claim 1, wherein, in step (a), the sequential forming of an etching object material layer, the photoresist layer, and the metal layer on the substrate comprises:
sequentially forming the metal layer and a polymer layer on the photoresist layer;
forming the first pattern in the polymer layer; and
etching the metal layer using the polymer layer patterned to the first pattern as an etch mask and removing the polymer layer.

5. The method of claim 4, wherein the polymer layer is patterned to the first pattern using an imprinting method or an electron beam lithography method.

6. The method of claim 1, wherein, in step (a), the sequential forming of an etching object material layer, a photoresist layer, and a metal layer on a substrate further comprises forming an antireflection film between the etching object material layer and the photoresist layer.

7. The method of claim 1, wherein, in step (b), the irradiating of light onto the surface of the metal layer comprises irradiating polarized light, in which the polarization direction is aligned with a direction in which the first pattern is repeatedly arranged.

8. The method of claim 1, wherein (b) the irradiating of light onto the surface of the metal layer comprises irradiating light having a wavelength greater than the predetermined interval between the patterns of the first pattern.

9. The method of claim 8, wherein the wavelength is at least four times greater than the predetermined interval between the patterns of the first pattern.

10. A method of manufacturing a master, comprising:
(a) sequentially forming a photoresist layer and a metal layer patterned to a first pattern having a structure in which patterns are repeatedly arranged with a predetermined interval on a substrate;
(b) irradiating light onto a surface of the metal layer to excite surface plasmon so that optical energy transmitted by the surface plasmon is distributed to expose middle portions of the photoresist layer between the patterns of the metal layer to form a second pattern on the photoresist layer;
(c) removing the patterned metal layer and developing the photoresist layer; and
(d) etching the substrate using the photoresist layer patterned to the second pattern as a mask.

11. The method of claim 10, wherein the first pattern is comprised of line patterns.

12. The method of claim 10, wherein the second pattern has a pattern density greater than that of the first pattern.

13. The method of claim 10, wherein, in step (a), the sequential forming of the photoresist layer and the metal layer patterned to the first pattern on the substrate comprises:
sequentially forming the metal layer and a polymer layer on the photoresist layer;
forming the first pattern in the polymer layer; and
etching the metal layer using the polymer layer patterned to the first pattern as an etch mask and removing the polymer layer.

14. The method of claim 13, wherein the polymer layer is patterned to the first pattern using an imprinting method or an electron beam lithography method.

15. The method of claim 10, wherein (b) the irradiating of light onto the surface of the metal layer comprises irradiating polarized light, in which the polarization direction is aligned with a direction in which the first pattern is repeatedly arranged.

16. The method of claim 10, wherein, in step (b), the irradiating of light onto the surface of the metal layer comprises irradiating light having a wavelength greater than the predetermined interval between the patterns of the first pattern.

17. The method of claim 16, wherein the wavelength is at least four times greater than the predetermined interval between the patterns of the first pattern.

18. A method of manufacturing a discrete track magnetic recording medium comprising:
(a) sequentially forming on a substrate an under layer, a recording layer, a photoresist layer, and a metal layer patterned to a first pattern having a structure in which line patterns that form concentric circles are repeatedly arranged with a predetermined interval;
(b) irradiating light onto a surface of the metal layer to excite surface plasmon so that the photoresist layer is exposed to a second pattern by the surface plasmon;
(c) removing the patterned metal layer and developing the photoresist layer; and
(d) etching the recording layer using the photoresist layer patterned to the second pattern as a mask.

19. The method of claim 18, wherein the second pattern has a pattern density greater than that of the first pattern.

20. The method of claim 18, wherein, in step (a), the sequential forming of the under layer, the recording layer, the photoresist layer, and the metal layer on the substrate comprises;
sequentially forming the metal layer and a polymer layer on the photoresist layer;
forming the first pattern in the polymer layer; and
etching the metal layer using the polymer layer patterned to the first pattern as an etch mask and removing the polymer layer.

21. The method of claim 20, wherein the polymer layer is patterned to the first pattern using an imprinting method or an electron beam lithography method.

22. The method of claim 18, wherein, in step (b), the irradiating of light onto the surface of the metal layer comprises irradiating polarized light, in which the polarization direction is aligned with a direction in which the first pattern is repeatedly arranged.

23. The method of claim 22, wherein light is irradiated through a polarizing plate having a polarization axis in a direction in which the first pattern is repeatedly arranged, while rotating the substrate with respect to an axis of symmetry of the concentric circles.

24. The method of claim 23, wherein light is irradiated while driving the polarizing plate to move along a radius direction of the concentric circles.

25. The method of claim 18, wherein, in step (b), the irradiating of light onto the surface of the metal layer comprises irradiating light having a wavelength greater than the interval between the line patterns of the first pattern.

* * * * *